(12) United States Patent
Dai et al.

(10) Patent No.: US 8,737,045 B2
(45) Date of Patent: May 27, 2014

(54) ELECTRONIC DEVICE HOUSING AND MANUFACTURING METHOD THEREOF

(75) Inventors: Bin Dai, ShenZhen (CN); Fa-Guang Shi, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 214 days.

(21) Appl. No.: 12/965,856

(22) Filed: Dec. 11, 2010

(65) Prior Publication Data

US 2012/0033357 A1 Feb. 9, 2012

(30) Foreign Application Priority Data

Aug. 9, 2010 (CN) .......................... 2010 1 0248392

(51) Int. Cl.
*H05K 5/00* (2006.01)
*H05K 7/00* (2006.01)
*H05K 1/03* (2006.01)
*A47B 81/00* (2006.01)
*H01R 13/502* (2006.01)

(52) U.S. Cl.
USPC ............ 361/679.01; 361/679.27; 361/679.28; 361/679.29; 361/679.55; 361/679.56; 361/679.57; 361/679.58; 312/223.1; 312/223.2; 312/274; 174/255; 174/563

(58) Field of Classification Search
USPC ............ 361/679.01, 679.02, 679.08, 679.09, 361/679.3, 679.55–679.59; 455/325, 556.1, 455/550.1, 90.1, 575.1; 174/535
See application file for complete search history.

(56) References Cited

U.S. PATENT DOCUMENTS

| 6,547,252 B1* | 4/2003 | Kahl et al. ..................... 277/590 |
| 2004/0090737 A1* | 5/2004 | Shimura et al. ............... 361/679 |
| 2010/0061040 A1* | 3/2010 | Dabov et al. ............. 361/679.01 |

FOREIGN PATENT DOCUMENTS

| CN | 1499917 A | 5/2004 |
| CN | 201491423 U | 5/2010 |

* cited by examiner

*Primary Examiner* — Jenny L Wagner
*Assistant Examiner* — Jerry Wu
(74) *Attorney, Agent, or Firm* — Novak Druce Connolly Bove + Quigg LLP

(57) ABSTRACT

An electronic device housing includes a bottom housing, a support frame, and a plastic side frame. The support frame is fixed on the bottom housing to form a receiving groove between the bottom housing and the plastic side frame. The plastic side frame is integrally formed by injecting a plastic material in the receiving groove. A manufacturing method for an electronic device housing is also provided.

12 Claims, 5 Drawing Sheets

ELECTRONIC DEVICE HOUSING AND MANUFACTURING METHOD THEREOF

CROSS-REFERENCE TO RELATED APPLICATIONS

This application is related to one co-pending U.S. patent application, which is: application Ser. No. 12/965,853, and entitled "ELECTRONIC DEVICE HOUSING AND MANUFACTURING METHOD THEREOF". Such application has the same assignee as the instant application and are concurrently filed herewith. The disclosure of the above-identified application is incorporated herein by reference.

BACKGROUND

1. Technical Field

The present disclosure relates generally to electronic device housings, more particularly, to an electronic device housing manufactured by injection molding.

2. Description of Related Art

Referring to FIG. 5, an electronic device housing 10 includes a bottom housing 11, a top cover 12, and a side frame 13. The periphery of the top cover 12 is welded to the bottom housing 11. The top cover 12 defines an assembly groove (not labeled). The side frame 13 is positioned in the assembly groove of the top cover 12. An adhesive layer 14 is positioned between the side frame 13 and the top cover 12, thus fixing the side frame 13 to the top cover 12.

However, during manufacture, the top cover 12 is welded to the bottom housing 11, and the side frame 13 is adhered to the top cover 12. Therefore, a process for manufacturing the electronic device housing 10 is complicated. In addition, a welding portion between the top cover 12 and the bottom housing 11 may experience discoloration after polishing, thus negatively affecting the electronic device appearance.

Therefore, there is room for improvement within the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
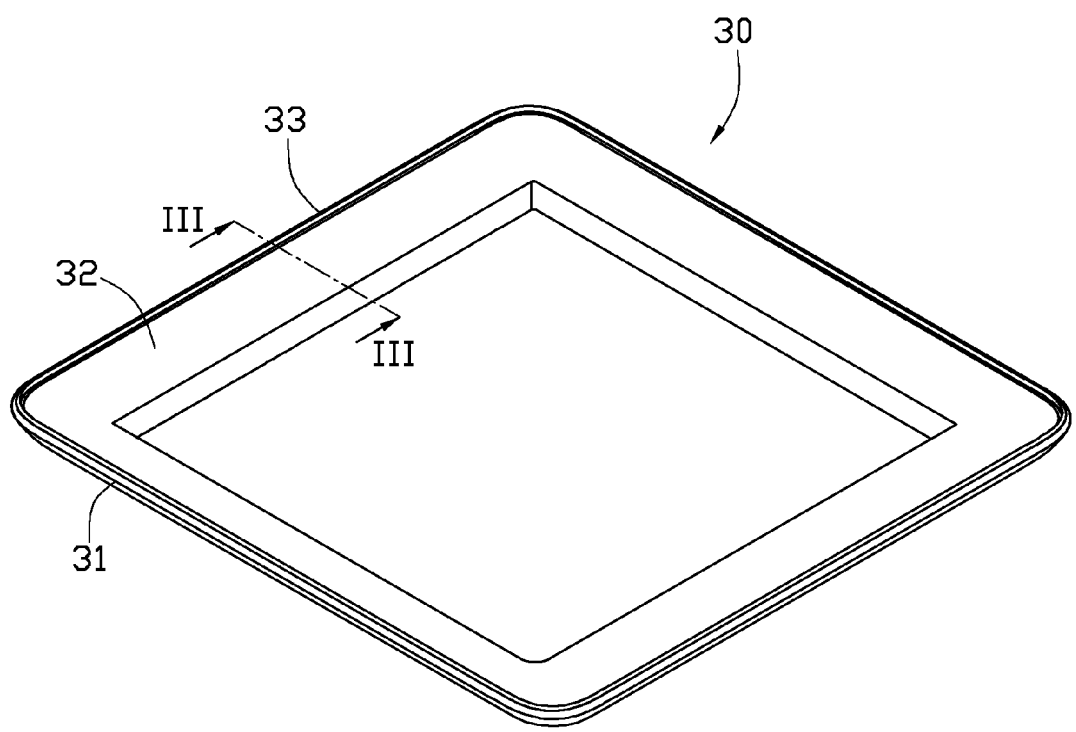
FIG. 1 is an isometric view of an embodiment of an electronic device housing including a bottom housing, a support frame, and a plastic side frame.

Referring to FIG. 1, an embodiment of an electronic device housing 30 includes a bottom housing 31, a support frame 32, and a plastic side frame 33.

Figure 2:
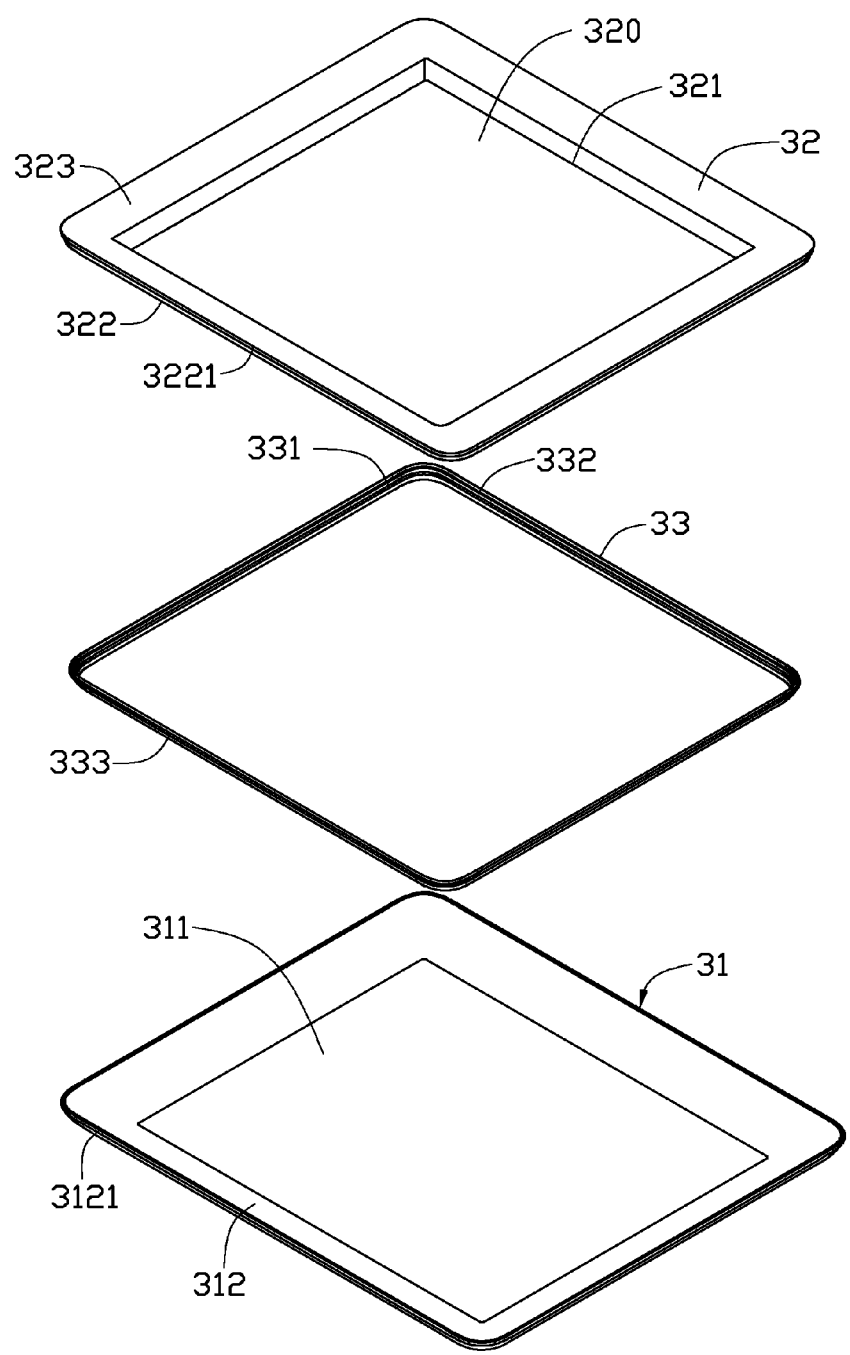
FIG. 2 an exploded, isometric view of the electronic device housing of FIG. 1.
Figure 3:
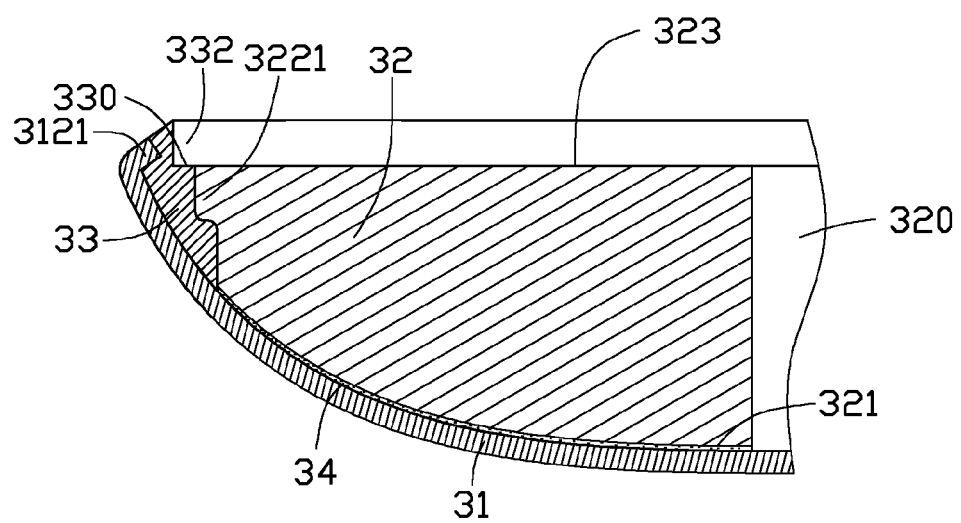
FIG. 3 is a partial cross-section of the electronic device housing of FIG. 1, taken along line III-III.
Figure 4:
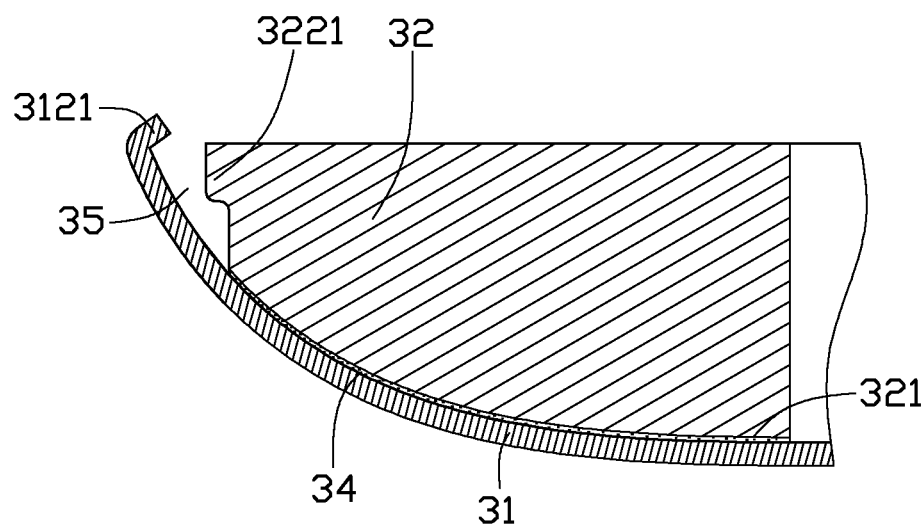
FIG. 4 is similar to FIG. 3, but without the plastic side frame.
Figure 5:
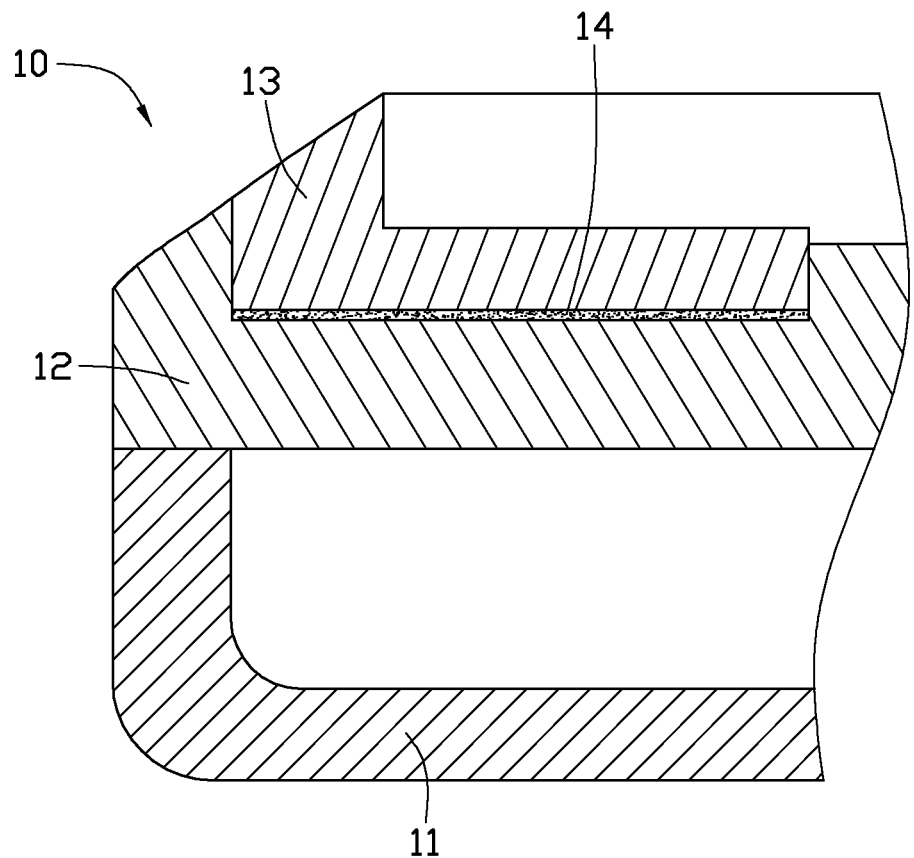
FIG. 5 is an isometric view of a commonly used electronic device housing.

Referring to FIGS. 2 through 4, the bottom housing 31 includes a base plate 311 and a sidewall 312 extending from a plurality of edges of the base plate 311. The sidewall 312 forms a connecting portion 3121 at a top end. In the illustrated embodiment, the base plate 311 is substantially rectangular, and the sidewall 312 is substantially curved. The connecting portion 3121 is a substantially rectangular ring.

A bottom surface 321 of the support frame 32 is fixed to an inner surface of the sidewall 312 of the bottom housing 31. A side surface 322 of the support frame 32 forms a positioning portion 3221. The support frame 32 defines an opening 320 through the bottom surface 321 and a top surface 323. In the illustrated embodiment, the support frame 32 is substantially rectangular. The support frame 32 is adhered to the inner surface of the sidewall 312 via an adhesive member 34. The adhesive member 34 is a double-sided adhesive layer in this embodiment. A receiving groove 35 (see FIG. 4) is formed between the support frame 32 and the bottom housing 31. It should be pointed out that the support frame 32 can be fixed to the sidewall 312 by other methods or means. For example, a fixing protrusion can be formed on the sidewall 312, with the support frame 32 defining a fixing hole for receiving the fixing protrusion.

The plastic side frame 33 is positioned in the receiving groove 35. An inner surface of the plastic side frame 33 defines a positioning groove 331 for receiving the positioning portion 3221 of the support frame 32, and an assembly groove 332 at a top end above the positioning groove 331 and the support frame 32 for receiving a display panel (not shown). A bottom surface 330 of the plastic side frame 33 received in the assembly groove 332 is coplanar to the top surface 323 of the support frame 32. The assembly groove 332 communicates with the opening 320 of the support frame 32. An outer surface of the plastic side frame 33 defines a connecting groove 333 at a top portion thereof, which is configured to receive the connecting portion 3121 of the bottom housing 31. In the illustrated embodiment, all of the positioning groove 331, the assembly groove 332, and the connecting groove 333 are a plurality of substantially rectangular grooves.

A manufacturing method for the electronic device housing 30 follows. First, the bottom housing 31 and the support frame 32 are provided. Second, the support frame 32 is fixed on the bottom housing 31, thereby forming the receiving groove 35 between the support frame 32 and the bottom housing 31. In the illustrated embodiment, the support frame 32 is adhered to the bottom housing 31 via the adhesive member 34. Third, a molten plastic material is injected towards the receiving groove 35. In the illustrated embodiment, the bottom housing 31 and the support frame 32 are positioned together in an injection mold (not shown), and the molten plastic material is injected towards the positioning groove 325. Fourth, the molten plastic material is cooled to integrally form the plastic side frame 33 between the bottom housing 31 and the support frame 32. In the illustrated embodiment, after the molten plastic material is cooled, the plastic side frame 33 defines a positioning groove 331 to receive the positioning portion 3221 of the support frame 32, and a connecting groove 333 to receiving the connecting portion 3121 of the bottom housing 31, and an assembly groove 332 to receive the display panel.

As described, during manufacture, no welding of the bottom housing 31 and the support frame 32 nor polishing thereof is required, thus the electronic device housing 30 is more easily manufactured, with optimum appearance. In addition, the support frame 32 is connected to the bottom housing 31 via the plastic side frame 33, thus enhancing a connecting strength of the electronic device housing 30.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device housing, comprising:
   a bottom housing comprising an inner surface;
   a support frame comprising a top surface, a bottom surface and a side surface, the bottom surface of the support frame fixed on the inner surface of the bottom housing the support frame defining an opening through the top surface and the bottom surface thereof; and
   a plastic side frame defining an assembly groove at a top end thereof, and located above the support frame, the assembly groove of the plastic side frame communicating with the opening of the support frame,
   wherein the plastic side frame comprising a plurality of steps, and fully occupies a receiving groove formed between the support frame and the bottom housing, the plastic side frame is latched with the side surface of the support frame and the inner surface of the bottom housing without a gap, the bottom housing is connected to the support frame via the plastic side frame, and one of the plurality of steps received in the assembly groove is coplanar to the top surface of the support frame.

2. The electronic device housing of claim 1, wherein the bottom housing comprises a base plate and a sidewall extending from a plurality of edges of the base plate, and the sidewall is substantially curved.

3. The electronic device housing of claim 2, wherein the sidewall forms a connecting portion at a top end thereof, and the connecting portion is a substantially rectangular ring; the plastic side frame defines a connecting groove, and the connecting portion is received in the connecting groove of the plastic side frame.

4. The electronic device housing of claim 1, wherein the support frame forms a positioning portion in the receiving groove, and the plastic side frame defines a positioning groove for receiving the positioning portion of the support frame, and the assembly groove is located above the positioning groove.

5. The electronic device housing of claim 1, wherein the support frame is fixed on the bottom housing via an adhesive member.

6. The electronic device housing of claim 5, wherein the adhesive member is a double-sided adhesive layer.

7. A method of manufacturing an electronic device housing, comprising:
   providing a bottom housing comprising an inner surface and a support frame comprising a top surface, a bottom surface and a side surface with a plurality of steps, and the support frame defining an opening through the top surface and the bottom surface thereof;
   fixing the bottom surface of the support frame on the inner surface of the bottom housing, thus forming a receiving groove between the side surface of the support frame and the bottom housing;
   injecting a molten plastic material towards the receiving groove, wherein the molten plastic fully fills the receiving groove; and cooling the molten plastic material to form a plastic side frame seamlessly fully occupying between the inner surface of the bottom housing and the side surface of the support frame, and the plastic side frame defining an assembly groove at a top end thereof communicating with the opening of the support frame, and located above the support frame, and a stepped surface of the plastic side frame received in the assembly groove coplanar to the top surface of the support frame.

8. The method of claim 7, wherein the bottom housing comprises a base plate and a sidewall extending from a plurality of edges of the base plate, and the sidewall is substantially curved.

9. The method of claim 8, wherein the sidewall forms a connecting portion at a top end thereof, and the connecting portion is a substantially rectangular ring; after cooling the molten plastic material, the plastic side frame defines a connecting groove for receiving the connecting portion.

10. The method of claim 7, wherein the support frame forms a positioning portion in the receiving groove, and after cooling the molten plastic material, the side plastic side frame defines a positioning groove below the assembly groove for receiving the positioning portion.

11. The method of claim 7, wherein the support frame is fixed on the bottom housing via an adhesive member.

12. The method of claim 11, wherein the adhesive member is a double-sided adhesive layer.

* * * * *